United States Patent
Joo

(10) Patent No.: US 6,198,667 B1
(45) Date of Patent: Mar. 6, 2001

(54) PLURAL MEMORY BANKS DEVICE THAT CAN SIMULTANEOUSLY READ FROM OR WRITE TO ALL OF THE MEMORY BANKS DURING TESTING

(75) Inventor: Yang-Sung Joo, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/290,399

(22) Filed: Apr. 13, 1999

(30) Foreign Application Priority Data

Feb. 12, 1999 (KR) .................................................. 99-5021

(51) Int. Cl.[7] ......................................................... G11C 7/00
(52) U.S. Cl. ............... 365/189.04; 365/201; 365/230.03; 714/763
(58) Field of Search .............................. 365/189.04, 201, 365/230.03, 230.08; 714/763

(56) References Cited

U.S. PATENT DOCUMENTS

| | | | |
|---|---|---|---|
| 5,530,836 | * 6/1996 | Busch et al. ........................ | 395/477 |
| 5,587,950 | 12/1996 | Sawada et al. ...................... | 365/201 |
| 5,959,911 | * 9/1999 | Krause et al. ...................... | 365/201 |
| 5,959,930 | * 9/1999 | Sakurai ............................... | 365/230.03 |
| 5,996,106 | * 11/1999 | Seyyedy ............................... | 714/763 |
| 6,003,111 | * 12/1999 | Holman et al. ..................... | 711/5 |

* cited by examiner

Primary Examiner—David Nelms
Assistant Examiner—Connie C. Yoha

(57) ABSTRACT

A semiconductor memory apparatus having a multi-bank memory array and data input/output method are disclosed. A plurality of memory banks are row-accessed at one time and a plurality of write enable signals are outputted to enable a buffer unit in accordance with an all bank selection signal and externally applied data are written to the plurality of memory banks through the enabled buffer unit. Also, a plurality of write enable signals are outputted to enable a buffer unit in accordance with an all bank selection signal and respective data outputted from the memory banks are checked to determine whether corresponding locations in the memory banks have the same logic levels so as to implement a simultaneous access of the memory banks. The same data is simultaneously written on corresponding same locations in the memory banks, thereby significantly decreasing the time required for the test.

18 Claims, 6 Drawing Sheets

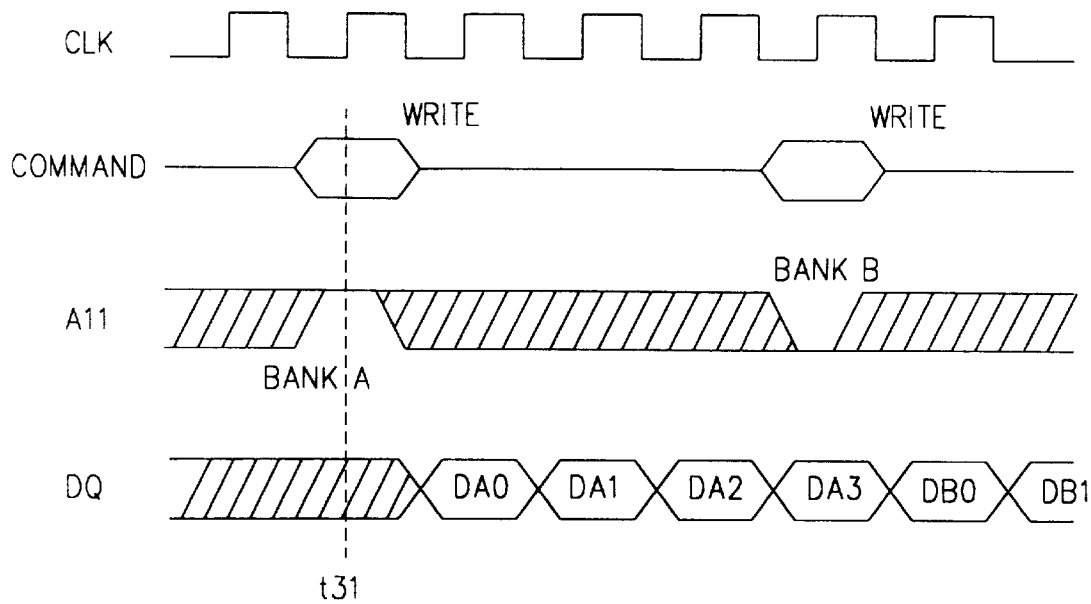
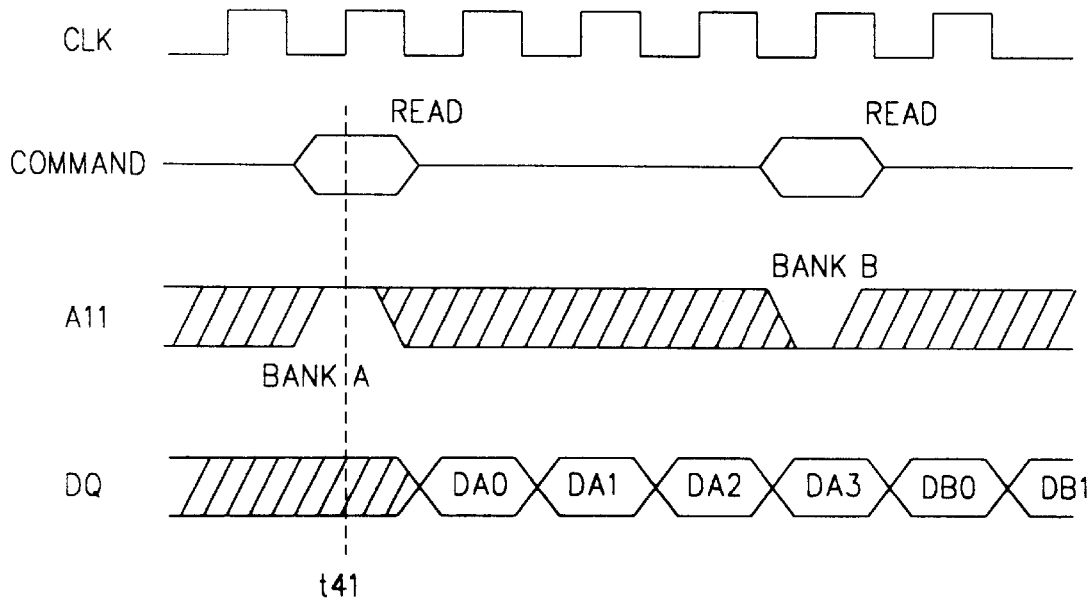

PLURAL MEMORY BANKS DEVICE THAT CAN SIMULTANEOUSLY READ FROM OR WRITE TO ALL OF THE MEMORY BANKS DURING TESTING

BACKGROUND OF THE INVENTION

1. Field of the Invention

The present invention relates to a semiconductor memory device having a multi-bank memory array, and more particularly, to an improved semiconductor memory device having a multi-bank memory array and data input/output method thereof, capable of collectively performing writing and reading with regard to a plurality of memory banks when testing a plurality of memory banks.

2. Description of the Background Art

In order to store massive information in a memory, a plurality of memory arrays are connected in parallel inside one semiconductor memory chip so as to effectively employ the memory. Such a memory array is referred to as memory bank. For simplicity of explanation, it is assumed that there are two memory banks in the application of the present invention.

FIG. 1 is a block diagram illustrating a conventional semiconductor memory device having a multi-bank memory array. As shown therein, a command decoder 1 receives a plurality of control signals /CS, /RAS, /CAS, /WE to allow a system to implement various operations. A controller 2 controls respective units in accordance with the command from the command decoder 1. A mode register 3 stores therein operation characteristic values such as system latency, burst length, etc., while externally receiving address signals A0–A11 so as to be setup.

The address signals A0–A10 among the external address signals A0–A11 are applied to a row address butter 4 and a column address buffer 5, and the row address buffer 4 transfers a row address signal to two memory banks 6, 7, and also the column address buffer 5 transfers a column address signal to the two memory banks 6, 7, whereby a data input/output path of the two memory banks 6, 7 is formed. Meanwhile, the memory banks 6, 7 respectively include a row decoder, a column decoder and a memory array.

A bank selector 8 is enabled by an enable signal BANKEN from the controller 2 and alters and outputs respective levels of first and second bank enable signals XBANK1, XBANK2 in accordance with the bank selection address signal A11.

Among the two memory banks 6, 7, the first memory bank 6 is enabled by the first bank enable signal XBANK1, and the second memory bank 7 is enabled by the second bank enable signal XBANK2. A plurality of internal word lines are enabled by internal addresses outputted from row and column address buffers 4, 5, whereby the first and second memory banks 6, 7 store data or output stored data.

An input controller 9 is enabled by an input enable signal IEN from the controller 2 or an output enable signal OEN and outputs a write and read enable signal to a buffer unit 10 in accordance with the bank selection address signal A11.

The buffer unit 10 is controlled by a write enable signal WEN and a read enable signal REN from an input/output controller 9 and transfers data to respective memory arrays of the two memory banks 6, 7 or externally outputs the data outputted from the respective memory array.

In the thusly constituted conventional apparatus, the two memory banks 6,7 are selectively enabled in accordance with a logic state of the bank selection address signal A11, and the system mode is divided into a row access mode, a write mode, or a read mode, in accordance with the state of a command signal COMMAND (see FIG. 2).

With reference to FIG. 2, the row access operation will now be described.

FIG. 2 shows timing diagrams illustrating row access, wherein a clock signal CLK, a command signal COMMAND and address signals A0–A11 are respectively shown.

At time point t21, if the command signal COMMAND is activated for row access, a high level enable signal BANKEN is outputted from the controller 2 to the bank selector 8. Also, when the bank selection address signal A11 becomes a high level at time point t21, the bank selector 8 outputs a high level first bank enable signal XBANK1 and a low level second bank enable signal XBANK2. Likewise, since the first bank enable signal XBANK1 becomes a high level, the first memory bank 6 is row-accessed, whereby the first memory bank 6 becomes ready to perform a write or read operation, whereas the second memory bank 7 is not row-accessed.

Also, at time point t21, the address signals A0–A10 are applied in common to the two memory banks 6, 7 via the row address buffer 4. At this time, since only the first memory bank 6 is row-accessed as described above, although a word line of the first memory bank 6 is enabled, the word line of the second memory bank 6 is not enabled.

At time point t22 after a time period tRRD has lapsed, when the bank selection address signal A11 is transited to a low level, the second memory bank 7 becomes low-accessed, whereas the first memory bank 6 is not low-accessed. That is, the logic level of the two bank enable signals XBANK1, XBANK2 of the bank selector 8 becomes contrary to the logic level at time point t21 as discussed above. In other words, when a low level bank selection address signal A11 is applied, the first bank enable signal XBANK1 is outputted at a low level and the second bank enable signal XBANK2 is outputted at a high level. Accordingly, the word line of the first memory bank 6 is not enabled and the word line of the second memory bank 6 is enabled.

Here, the time period tRRD represents a row active-to-active interval so that the one memory bank 6 is enabled and the other memory bank 7 is enabled, and it is determined by an initial design.

The write operation will now be described.

FIG. 3 shows timing diagrams illustrating write operation. As shown therein, when a command signal COMMAND is activated in order to set a memory bank as a write mode at time point t31 and the bank selection address signal A11 is at high level, the first memory bank 6 becomes enabled. Also, the input/output controller 9 outputs a high level read enable signal REN so that the buffer unit 10 forms a data read path with regard to the first memory bank 6. Accordingly, the data DQ as shown in FIG. 3 is transferred to the first memory bank 6, thereby performing a write operation with regard to the memory bank 6. Here, symbols DA0, DA1, DA2 and DA3 denote that the data to write is applied to the first memory bank 6.

Meanwhile, when the bank selection address signal A11 is at a low level, a data read path with regard to the second memory bank 7 is formed by the input/output controller 9, whereby the write operation with regard to the second memory bank 6 is implemented.

Referring to FIG. 4, a read operation will now be described.

The read operation is implemented in a method similar to the write operation. That is, the command signal COMMAND is activated in order to determine a memory bank as a read mode at time point t41. When the bank selection address signal A11 becomes a high level, a data write path with regard to the first memory bank 6 is formed by the input/output controller 9, whereby data DQ as shown in FIG. 4 is externally outputted via the first output buffer OBUF1.

Meanwhile, when the bank selection address signal A11 is at a low level, the read operation with regard to the second memory bank 6 is implemented.

Banks are individually distinguished in the conventional art because a row access is implemented with regard to one bank. After a predetermined time tRRD, the row access is performed with regard to other banks so as to decrease latency. However, respective banks are separately accessed so as to disadvantageously increase access time. Further, as the number of banks increases so does the access time in proportion thereto.

Moreover, in case of system testing, respective data values used for same cell locations with regard to a plurality of banks are identical in most instances. In that case, as shown in FIG. 2, the predetermined time tRRD set for respective access to banks and access time for remaining banks except for one memory bank are unnecessary and this may cause inefficiency of the system.

In other words, assuming that there are four memory banks and the data having identical values are used for identical column addresses of the four banks, the time for writing data on the remaining three banks except for one bank becomes an unnecessary time. In the same mechanism, assuming that there are four banks and the data values from the four memory banks are used by their compression, the time for reading data from the remaining three memory banks becomes unnecessary.

SUMMARY OF THE INVENTION

Accordingly, it is an object of the present invention to provide a semiconductor memory device having a multi-bank memory array, capable of decreasing test time by simultaneously accessing a plurality of banks when testing the multi-bank memory array.

It is another object of the present invention to provide a semiconductor memory device having a multi-bank memory array, capable of decreasing test time by simultaneously performing read and write operations with a plurality of banks when testing the multi-bank memory array.

To achieve the above-described objects, there is provided a semiconductor memory device having a multi-bank memory array according to the present invention which includes a plurality of memory banks respectively including a memory cell array, a bank selector for simultaneously row-accessing the plurality of memory banks, an input/output controller for outputting a plurality of write enable signals and a plurality of read enable signals in accordance with an all bank selection signal and a control signal, and a buffer unit for transmitting externally applied data to the plurality of memory banks by being enabled by the plurality of write enable signals and coinciding and outputting data from the plurality of memory banks by being enabled by the plurality of read enable signals.

Further, to achieve the above-described objects, there is provided a data input method of a semiconductor memory apparatus having a multi-bank memory array and performing an input/output of data of a plurality of memory banks respectively including a memory array, comprising the steps of row-accessing the plurality of memory banks at one time, outputting a plurality of write enable signals and enabling a buffer unit in accordance with an all bank selection signal, and writing externally applied data on the plurality of memory banks through the enabled buffer unit.

The features and advantages of the present invention will become more readily apparent from the detailed description given hereinafter. However, it should be understood that the detailed description and specific example, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein:

FIG. 3 shows timing diagrams illustrating write operation according to the conventional art;

FIG. 4 shows timing diagrams illustrating read operation according to the conventional art;

DETAILED DESCRIPTION OF THE PREFERRED EMBODIMENTS

Figure 1:
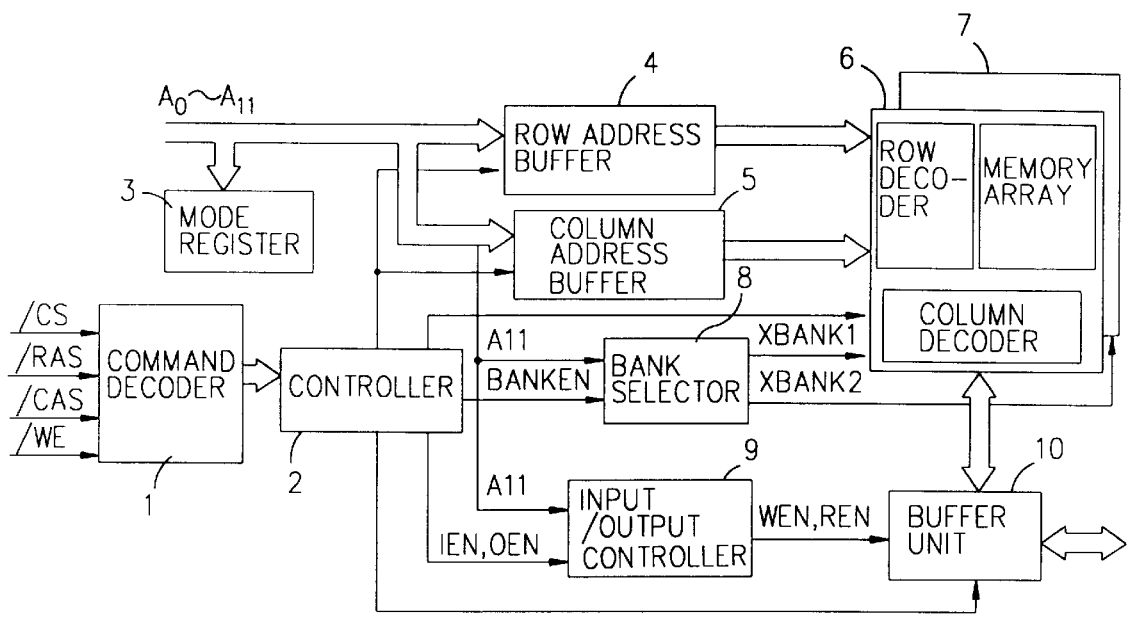
FIG. 1 is a block diagram illustrating a semiconductor memory apparatus having a multi-bank memory array according to the conventional art.
Figure 5:
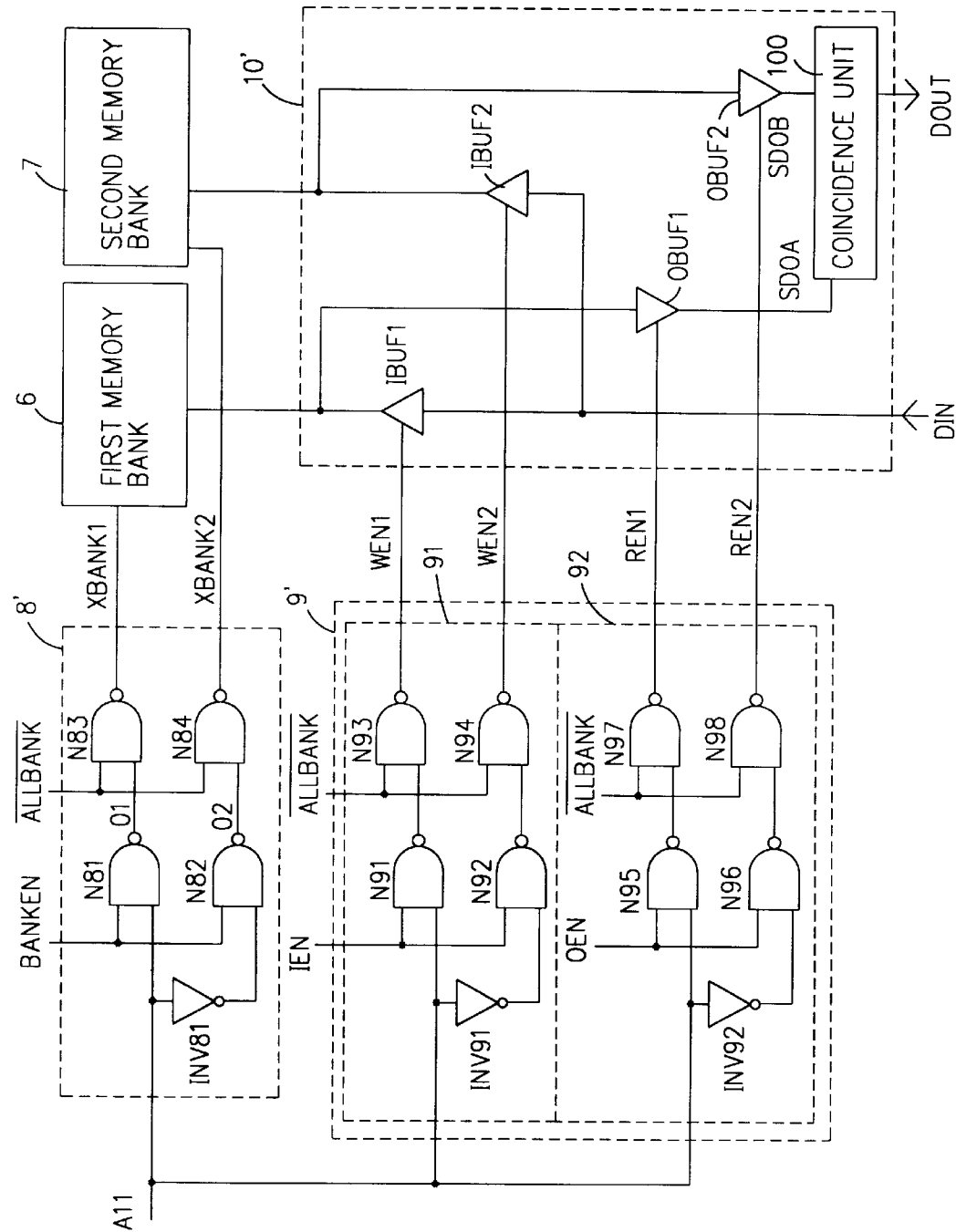
FIG. 5 is a block diagram illustrating a semiconductor memory apparatus having a multi-bank memory array according to the present invention.

FIG. 5 is a block diagram illustrating a semiconductor memory apparatus having a multi-bank memory array according to a first embodiment of the present invention, where the other elements not illustrated therein are identical to those of FIG. 1 and same numerals are used for explanation's sake.

As shown in FIG. 5, a bank selector 8' includes four NAND gates N81–N84 and one inverter INV81. The first NAND gate N81 NANDs a bank selection address signal A11 and a bank enable signal BANKEN from the controller 2 and outputs a first output signal O1. The second NAND gate N82 NANDs the bank selection address signal A11 level-inversed by the inverter INV81 and the enable signal BANKEN and outputs a second output signal O2. The third and fourth NAND gates N83, N84 respectively NAND two output signals O1, O2 and an inversed all bank selection signal /ALLBANK from the controller 2, and output two bank enable signals XBANK1, XBANK2 to first and second memory banks 6, 7.

As understood through the characteristics of a NAND gate, when the inversed all bank selection signal /ALLBANK from the two NAND gates N83, N84 is at a low level, the two NAND gates N83, N84 always output high level bank enable signals XBANK1, XBANK2 regardless of logic levels of the two output signals O1, O2, whereby the two memory banks 6, 7 are simultaneously enabled.

Here, the all bank selection signal ALLBANK is a signal for allowing the entire system to simultaneously enable the first and second memory banks 6, 7, wherein the setting for outputting the all bank selection signal ALLBANK may be implemented in the controller 2 or the command decoder 1. To the contrary, when the inversed all bank selection signal /ALLBANK is at a high level, respective levels of the two bank enable signals XBANK1, XBANK2 are determined in accordance with the two output signals O1, O2. Accordingly, the two memory banks 6, 7 are selectively enabled by the two output signals O1, O2.

Figure 7:
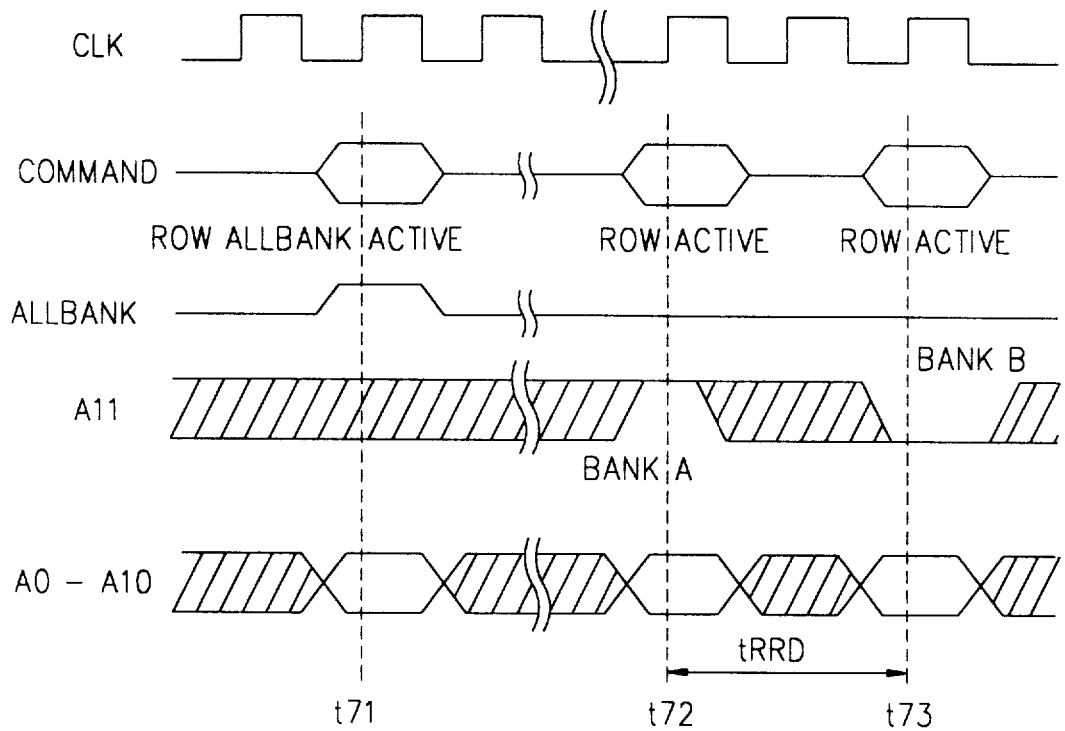
FIG. 7 shows timing diagrams illustrating row access according to the present invention.

FIG. 7 shows timing diagrams illustrating row access according to the first embodiment of the present invention. As shown therein, when the command signal COMMAND for row access at time point t71 is activated and the all bank selection signal ALLBANK is at a high level, the inversed all bank selection signal /ALLBANK becomes a low level and the third and fourth NAND gates N83m, N84 of the bank selector 8' respectively output high level two bank enable signals XBANK1, XBANK2 so that the first and second memory banks 6, 7 are both enabled without regard to a logic level of the bank selection address signal A11. Also, the address signals A0–A10 are applied in common to the two memory banks 6, 7 via a row address buffer 4 (not shown in FIG. 5). At this time, since the first and second memory banks 6, 7 are all enabled, respective word lines of the first and second memory banks 6, 7 are enabled.

Figure 2:
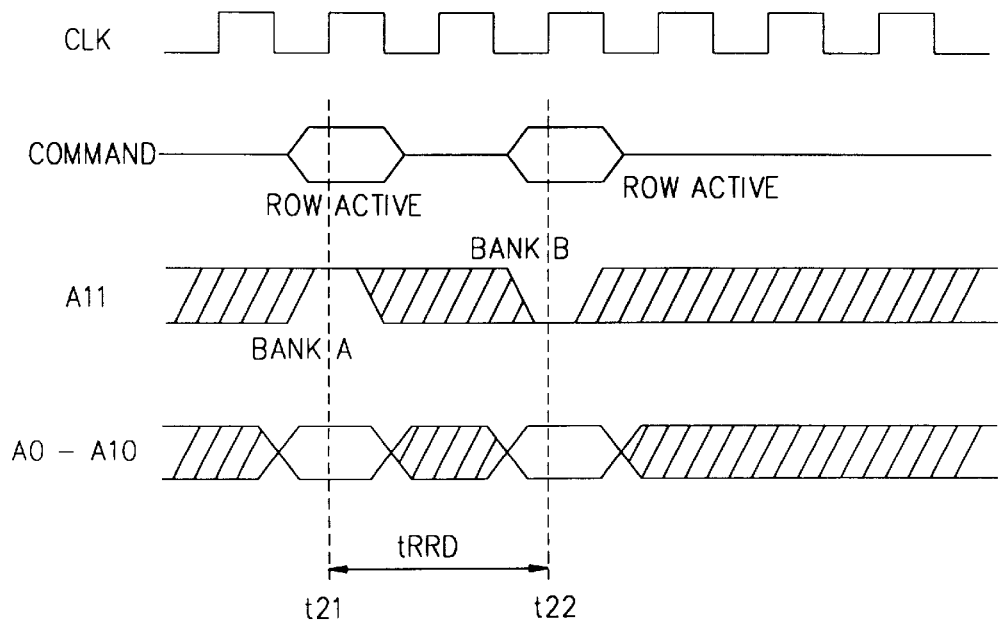
FIG. 2 shows timing diagrams illustrating row access according to the conventional art.

Meanwhile, time points t72, t73 correspond to time points t21, t22 as shown in FIG. 2. The all bank enable signal ALLBANK at respective time points t72, t73 is at a low level. Accordingly, the inversed all bank selection signal /ALLBANK is applied to third and fourth NAND gates N83, N84 and respective levels of the bank enable signals XBANK1, XBANK2 as output signals of the third and fourth AND gates N83, N84 are determined in accordance with the bank selection address signal A11, whereby one of the first memory bank 6 and the second memory bank 7 is selected in accordance with the logic state of the bank selection address signal A11.

Next, a write operation will now be described with reference to FIG. 8.

As shown in FIG. 5, an input/output controller 9' includes an input controller 91 for outputting write enable signals WEN1, WEN2 to the buffer unit 10' in accordance with the all bank selection signal ALLBANK, a bank selection address signal A11 and the input enable signal IEN from the controller 2, and an output controller 92 for outputting read enable signals REN1, REN2 to the buffer unit 10' in accordance with the all bank selection signal ALLBANK, the bank selection address signal A11 and the output enable signal OEN from the controller 2.

The input controller 91 includes four NAND gates N91–N94 and one inverter INV91 and their connections are same as those of four NAND gates N8–N84 and an inverter INV81 of the bank selector 8'. Also, the output controller 92 is provided for a read operation and its description will be made together with a read operation.

The first and second NAND gates N91, N92 output different logic levels of the bank selection address signal A11 in accordance with the input enable signal IEN from the controller 2 and when the all bank selection signal ALLBANK is at a high level, the third and fourth NAND gates N93, N94 output high level signals, respectively. The output signal WEN1 as a first write enable signal of the third NAND gate N93 enables the first input buffer IBUF1 of the buffer 10', and the output signal WEN2 of the fourth NAND gate N94 enables the second input buffer IBUF2 of the buffer unit 10'.

As shown in FIG. 5, there are provided two input buffers IBUF1, IBUF2 for a write operation. The first input buffer IBUF1 is connected between the input data line and the first memory bank 6 and enabled by the first write enable signal WEN1 from the input/output controller 9'. The second input buffer IBUF2 is connected between the input data line and the second memory bank 7 and enabled by the second write enable signal WEN2.

Figure 8:
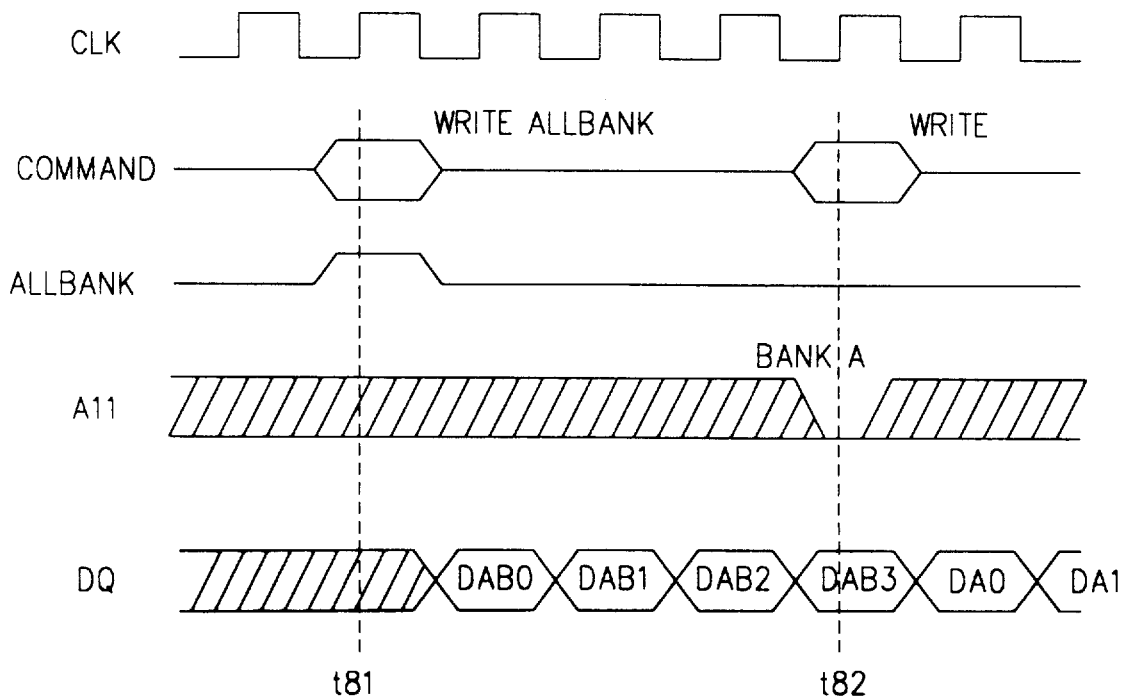
FIG. 8 shows timing diagrams illustrating write operation according to the present invention.

FIG. 8 shows timing diagrams for a write operation. As shown therein, when the command signal COMMAND for a write mode is activated at time point t81 and the all bank selection signal ALLBANK is at a high level, the inversed all bank selection signal /ALLBANK becomes a low level so that the third and fourth NAND gates N93, N94 output high level first and second write enable signals WEN1, WEN2, whereby the two input buffers IBUF1, IBUF2 are enabled at the same time. Accordingly, the data DQ is written on the first and second memory banks 6, 7 via the two input buffers IBUF1, IBUF2. That is, the data DQ is written on the same location (same row and same column) in each of the first and second memory banks 6, 7 of the memory array.

In FIG. 8, symbols DAB0, DAB1, DAB2 and DAB3 indicate that data are applied in common to the first and second memory banks 6, 7.

Meanwhile, at time point t82 corresponding to time point t31 in FIG. 3, one of the first memory bank 6 and the second memory bank 7 is selected in accordance with a logic state of the bank selection address signal A11. At this time, the all bank selection signal ALLBANK should maintain a low level.

Figure 9:
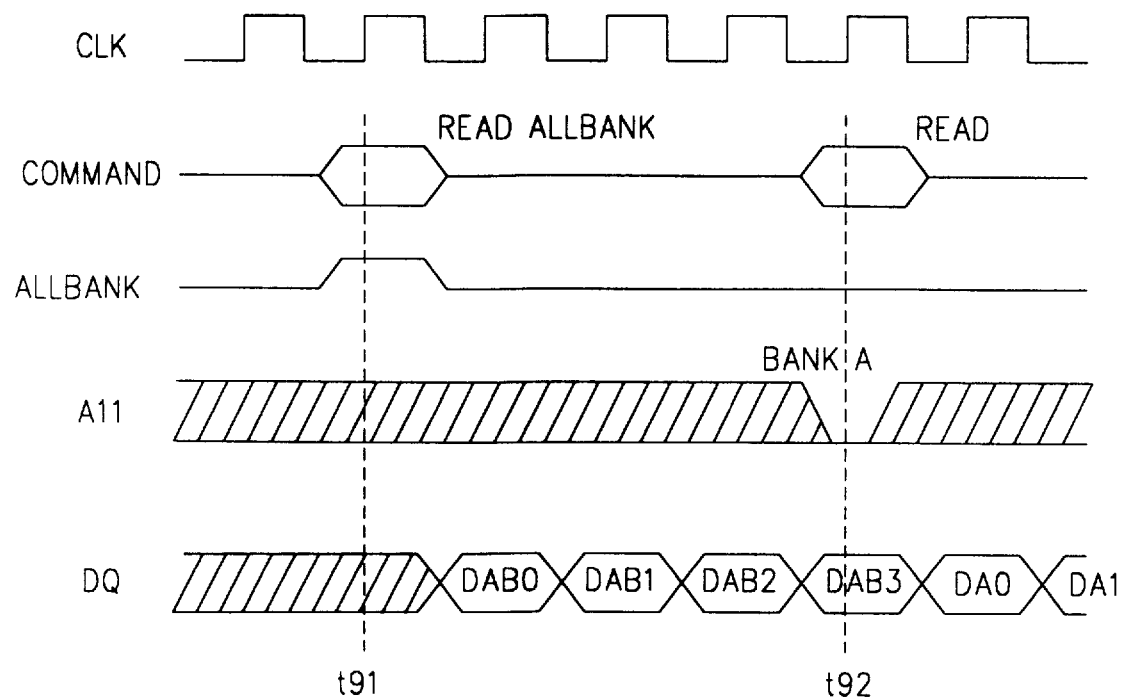
FIG. 9 shows timing diagrams illustrating read operation according to the present invention.

With reference to FIG. 9, a read operation will now be described and the read operation is implemented after the write operation described above.

The output controller 92 of the input/output controller 9' includes four NAND gates N95–N98 and one inverter INV92 and their connections are identical to those of the input controller 91.

The buffer 10' includes two output buffers OBUF1, OBUF2 and a coincidence unit 100. The fifth and sixth NAND gates N95, N96 output different logic levels of the bank selection address signal A11 in accordance with the output enable signal OEN and the seventh and eighth NAND gates N97, N98 output high level signals if the all bank selection signal ALLBANK is at a high level. The output signal REN of the seventh NAND gate N97 as a first read enable signal enables a first output buffer OBUF1 of the buffer 10', and the output signal REN2 of the eighth NAND gate N98 as the second read enable signal enables the second output buffer OBUF2 of the buffer 10".

When the two output buffers OBUF1, OBUF2 are enabled, the data from the first and second memory banks 6, 7 are applied to the coincidence unit 100 via the two output buffers OBUF1, OBUF2.

FIG. 9 shows timing diagrams illustrating the read operation. As shown therein, when the command signal COMMAND is activated at time point t91 and the all bank selection signal ALLBANK is at a high level, the seventh and eighth NAND gates N97, N98 output high level first and second read enable signals REN1, REN2 in accordance with reversed low level all bank selection signal /ALLBANK, whereby the two output buffers OBUF1, OBUF2 are simultaneously enabled. Accordingly, the data from the first memory bank 6 as an output data SDOA is applied to the coincidence unit 100 via the first output buffer OBUF1, and the data from the second memory bank 7 as an output data SDOB is applied to the coincidence unit 100 via the second output buffer OBUF2. Meanwhile, as described in the read operation, the data from the first and second memory banks 6, 7 are data written on the same location (same row and same column) as the data write location in the write operation.

The coincidence unit 100 determines whether the applied two output signals SDOA, SDOB have the same logic levels. That is, if the two output signals SDOA, SDOB have same logic levels, the output data DOUT having the same level is outputted and if the two output signals SDOA, SDOB have different levels, the output data is outputted at a high impedance state.

Figure 6:
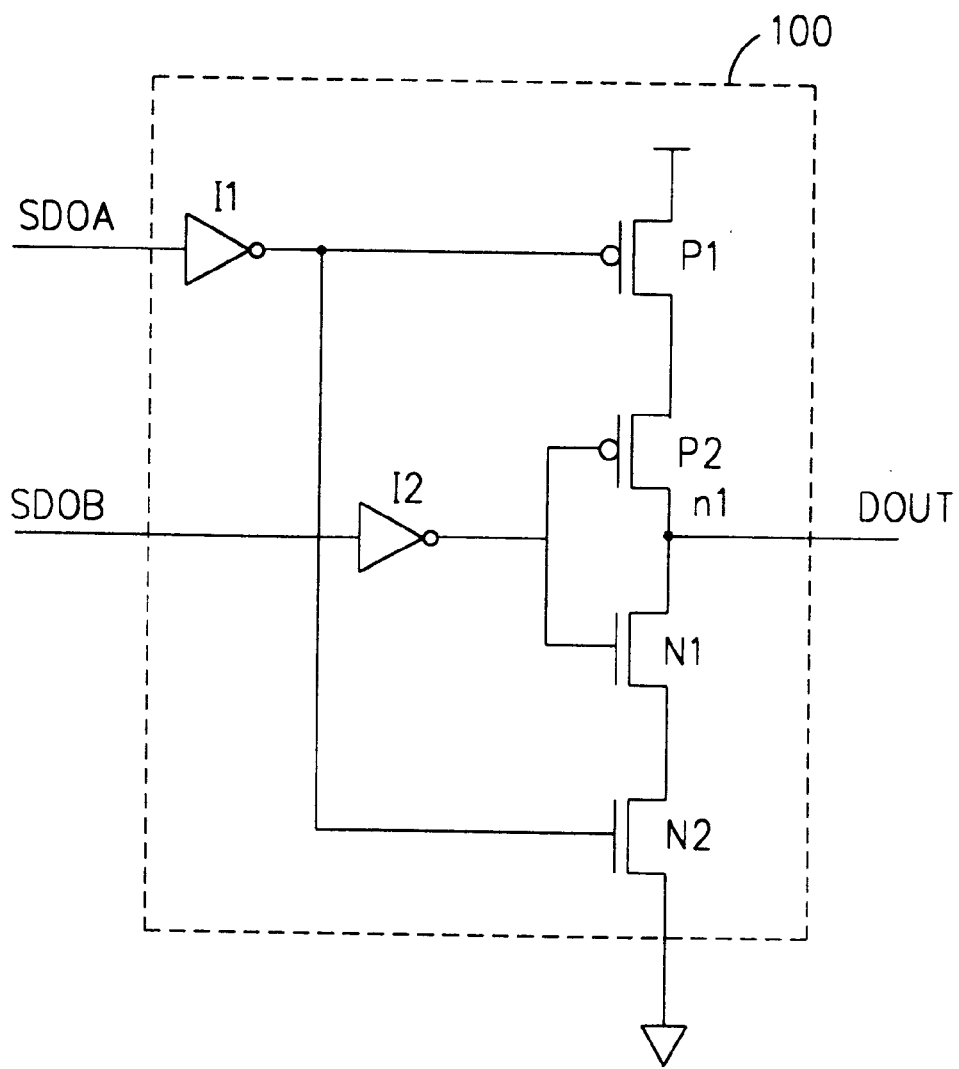
FIG. 6 is a view detailing a coincidence unit in FIG. 5.

The embodiment of the coincidence unit 100 is implemented in FIG. 6. As shown therein, two PMOS transistors P1, P2 and two NMOS transistors N1, N2 are serially connected between the source voltage and ground. Two inverters I1, I2 receive output signals SDOA, SDOB of the first and second output buffers OBUF1, OBUF2. The output signal of the first inverter I1 is applied to the gate of the first PMOS transistor P1 and the gate of the second NMOS transistor N2. The output signal of the second inverter I2 is applied to the gate of the second PMOS transistor P2 and the gate of the second NMOS transistor N1. The output terminal n1 of the coincidence unit n1 of the coincidence unit 100 is formed at a common node of the second PMOS transistor P2 and the second NMOS transistor N1.

With reference to the table in FIG. 6, the operation of the coincidence unit 100 will now be described. If two output signals SDOA, SDOB are all "1", the two PMOS transistors P1, P2 are turned on and the and the two NMOS transistor N1, N2 are turned off so that the output data DOUT becomes "1". To the contrary, if the two output signals SDOA, SDOB are all "0", the two PMOS transistors P1, P2 are turned off and the two NMOS transistors N1, N2 are turned on so that the output data DOUT becomes "0". If either of the output signals SDOA, SDOB is "0" and the other is "1", one of the two PMOS transistors P1, P2 is turned on and the other is turned off and also one of the NMOS transistors N1, N2 is turned on and the other is turned off so that the output data DOUT is at a high impedance state.

If the output data DOUT is "1", it is indicative that "1" is stored in a memory cell on each of the identical locations of the two memory banks 6, 7. To the contrary, if the output data DOUT is "0", it is indicative that "0" is stored in a memory cell on each or the identical locations of the two memory banks 6, 7. Also, if the output data DOUT is at a high impedance state, it is indicative that different values are stored in the memory cell at the identical locations of the two memory banks 6, 7.

The memory array test of the two memory banks 6, 7 is implemented by checking the data DOUT value from the buffer unit using an external data test device and such a test operation is widely known to those skilled in the art and its description will be omitted accordingly.

As described above, the present invention allows a plurality of memory banks to be simultaneously accessed during the test, and data having the same value are simultaneously written at the same location of the plurality of memory banks after the access. And also the written data is checked for coincidence at the output, whereby the plurality of memory banks are not required to be respectively enabled. Accordingly, the time required for the test is significantly decreased. Moreover, the more increased the number of memory banks, the more effective becomes the semiconductor memory apparatus according to the present invention.

When the system is in normal function without regard to simultaneous access of multiple memory banks in a normal mode other than a test mode, although the test mode has been described, a row access method is applicable. If same data are used on the same location of the multiple memory banks, the write operation is not applicable so that the write operation according to the present invention is not limited to the test mode and further applicable to the case of processing same data with regard to the multiple memory banks.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A semiconductor memory apparatus, having a multi-bank memory array, comprising:
   a plurality of memory banks representing said memory array;
   a bank selector for simultaneously accessing at least two of the plurality of memory banks;
   an input/output controller for selectively outputting a plurality of write enable signals and a plurality of read enable signals in accordance with the number of memory banks selected, a multiple bank selection signal and a control signal; and
   a buffer unit for transmitting externally applied data to the plurality of memory banks according to the plurality of write enable signals and for outputting data from the plurality of memory banks according to the plurality of read enable signals;
   wherein at least one of the bank selector and the input/output controller includes a plurality of NAND gates,
   wherein the buffer unit includes a coincidence unit to indicate whether all of the data outputted from the plurality of memory banks have an identical logical value, and to output the identical logic value when all of the data have the identical logical value.

2. The apparatus of claim 1, wherein the bank selector outputs a plurality of bank enable signals to the plurality of memory banks in accordance with a logic state of the multiple bank selection signal without regard to an applied bank selection address signal.

3. The apparatus of claim 1, wherein the bank selector comprises a logic circuit to output a plurality of high level bank enable signals to the plurality of memory banks in accordance with the multiple bank selection signal.

4. The apparatus of claim 3, wherein the logic circuit includes a plurality of NAND gates, respectively.

5. The apparatus of claim 4, wherein the bank selector comprises:
   a first NAND gate for receiving a bank selection address signal through an input terminal thereof;
   a second NAND gate for receiving an inversed bank selection address signal through an input terminal;

third and fourth NAND gates for receiving output signals of the first and second NAND gates and respectively outputting a bank enable signal; and wherein the first and second NAND gates receive enable signals through the other input terminals thereof, and the third and fourth NAND gates receive the multiple bank selection signal through the other input terminals thereof.

6. The apparatus of claim 1, wherein the input/output controller comprises a logic circuit to output the plurality of write enable signals at high level.

7. The apparatus of claim 6, wherein the logic circuit includes a plurality of NAND gates, respectively.

8. The apparatus of claim 7, wherein the input/output controller comprises:

a first NAND gate for receiving a bank selection address signal through an input terminal thereof;

a second NAND gate for receiving an inversed bank selection address signal through an input terminal;

third and fourth NAND gates for receiving output signals of the first and second NAND gates and respectively outputting the write enable signal; and wherein the first and second NAND gates receive input enable signals through the other input terminals thereof, and the third and fourth NAND gates receive the multiple bank selection signal through the other input terminals thereof.

9. The apparatus of claim 1, wherein the input/output controller comprises a logic circuit to output the plurality of read enable signals at high level.

10. The apparatus of claim 9, wherein the logic includes a plurality of NAND gates, respectively.

11. The apparatus of claim 10, wherein the input/output controller comprises:

a first NAND gate for receiving a bank selection address signal through an input terminal thereof;

a second NAND gate for receiving an inversed bank selection address signal through an input terminal;

third and fourth NAND gates for receiving output signals of the first and second NAND gates and respectively outputting the read enable signal; and wherein the first and second NAND gates receive output enable signals through the other input terminals thereof, and the third and fourth NAND gates receive the all bank selection signal through the other input terminals thereof.

12. The apparatus of claim 13, wherein the coincidence unit comprises:

first and second inverters for inverting respective logic values of the data outputted by said plurality of buffers;

a first PMOS transistor and a first NMOS transistor for receiving an output signal of the first inverter through respective gates thereof;

a second PMOS transistor and a second NMOS transistor for receiving an output signal of the second inverter; and wherein the second PMOS transistor and the second NMOS transistor are serially connected, the first PMOS transistor is connected between supply voltage and the second PMOS transistor, and the first NMOS transistor is connected between ground and the second NMOS transistor, and the output data is outputted from a node between the second PMOS transistor and the second NMOS transistor.

13. A semiconductor memory apparatus, having a multi-bank memory array, comprising:

a plurality of memory banks representing said memory array;

a bank selector to select at least two of the plurality of memory banks; and a coincidence unit to determine whether data outputted from the selected memory banks is all the same, said coincidence unit being operable to output a logic value if said data outputted from said selected memory banks all take on an identical logic value and to take on a high impedance state if data outputted from said selected memory banks do not all take on the identical logic value.

14. The apparatus of claim 13, further comprising:

an output controller to generate a plurality of read enable signals in accordance with the number of selected memory banks, a multiple bank selection signal and a control signal; and a plurality of buffers corresponding in number to said number of selected memory banks, respectively, and responsive to said plurality of read enable signals.

15. The apparatus of claim 13, wherein said logic value output from said coincidence is the identical logic value taken on by said data.

16. A method, of testing data in a semiconductor memory apparatus a plurality of memory banks representing a memory array, comprising:

selecting at least two of the plurality of memory banks;

generating a plurality of read enable signals in accordance with the number of selected memory banks, a multiple bank selection signal and a control signal;

outputting a logic value if data outputted from said selected memory banks all take on an identical logic value; and taking on a high impedance state if data outputted from said plurality of memory banks do not all take on the identical logic value.

17. The method of claim 16, wherein said logic value output in said outputting step is the identical logic value taken on by said data.

18. The method of claim 16, further comprising: buffering the outputs of said selected memory banks.

* * * * *